(12) United States Patent
Ohmi et al.

(10) Patent No.: US 6,379,755 B2
(45) Date of Patent: Apr. 30, 2002

(54) CYLINDRICAL COIL AND PRODUCTION PROCESS THEREOF

(75) Inventors: Hiroshi Ohmi, Anjo; Hiroshi Shimizu, Nagoya, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 08/022,199

(22) Filed: Feb. 25, 1993

(30) Foreign Application Priority Data

Feb. 25, 1992 (JP) ................................................ 4-37670

(51) Int. Cl.⁷ ................................ B05D 3/00; B05D 5/12
(52) U.S. Cl. ........................ 427/555; 427/116; 427/305; 427/231; 427/239; 427/554; 427/443.1
(58) Field of Search ............................... 427/305, 443.1, 427/116, 556, 555, 554, 230, 231, 239; 216/65, 94; 219/121.69

(56) References Cited

U.S. PATENT DOCUMENTS

| | | | |
|---|---|---|---|
| 4,361,592 A | * 11/1982 | Ajima et al. | 427/53.1 |
| 4,681,774 A | 7/1987 | Halliwell et al. | 427/555 |
| 4,686,114 A | * 8/1987 | Halliwell | 427/443.1 |
| 4,770,899 A | * 9/1988 | Zeller et al. | 427/443.1 |
| 4,870,751 A | * 10/1989 | Antoon | 29/852 |
| 4,882,200 A | * 11/1989 | Liu et al. | 427/53.1 |
| 4,903,674 A | 2/1990 | Bassett et al. | 123/634 |

FOREIGN PATENT DOCUMENTS

| | | |
|---|---|---|
| EP | 0287843 | 10/1988 |
| JP | 59-103320 | 6/1984 |
| JP | 61-006892 | 1/1986 |
| JP | 218580 | * 9/1987 |
| JP | 62212285 | 9/1987 |
| JP | 62218580 | 9/1987 |
| JP | 6383279 | 4/1988 |
| JP | 6385078 | 4/1988 |
| JP | 63139073 | 6/1988 |
| JP | 63-165581 | 7/1988 |
| JP | 1-104878 | 4/1989 |
| JP | 1141889 | 6/1989 |
| JP | 1-238007 | 9/1989 |
| JP | 3-122287 | 5/1991 |
| JP | 3-291383 | 12/1991 |

* cited by examiner

*Primary Examiner*—Brian K. Talbot
(74) *Attorney, Agent, or Firm*—Pillsbury Winthrop LLP Intellectual Property Group

(57) ABSTRACT

An electroless plating reaction catalyst is imparted to a substrate and then the catalyst is deactivated or removed at desired locations by irradiating with an energy beam to form groove portions in the substrate.

4 Claims, 8 Drawing Sheets

CYLINDRICAL COIL AND PRODUCTION PROCESS THEREOF

BACKGROUND OF THE INVENTION

1. Field of the Invention

The present invention relates to a method for selectively imparting an electroless plating catalyst on a substrate to be plated and to a cylindrical coil obtained using this method.

2. Description of the Related Art

In the past, it has been known to forming, for example, wiring on a printed circuit board by electroless plating employing means using a resist, as typically represented by an additive method.

The method of forming a pattern on a printed circuit board by the additive method called for an electroless plating reaction catalyst, for example, palladium (Pd), to be imparted to the surface of the insulating substrate, then the portions other than the conductor circuit of the substrate to be covered by a resist and the substrate covered with the resist to be immersed in an electroless plating solution, whereby electroless plating was applied on only the uncovered portions on the substrate. This additive method, however, had the problem of an extremely large number of steps and the need for complicated work, as mentioned above.

Therefore, in the past, to overcome this problem, for example, as disclosed in Japanese Unexamined Patent Publication (Kokai) No. 63-212285 or Japanese Unexamined Patent Publication (Kokai) No. 62-218580, there had been proposed the method of directly drawing the wiring on a ceramic substrate, without the use of a resist, by using the local heating effect of a laser. Explaining this method of using the local heating effect of a laser in more detail, when for example using an alumina nitride substrate, the irradiation of the laser causes a reaction of:

$$AlN \rightarrow Al^0 + \tfrac{1}{2} N_2$$

and changes the substrate to the metal (here, aluminum metal as shown by $Al^0$) at the laser-irradiated portions of the substrate. The aluminum metal obtained by this laser irradiation is, in turn, used as the nucleus for electroless plating, thereby forming a circuit.

In the above method, however, in the case of an alumina nitride substrate, for example, the substrate has to be placed in a vacuum atmosphere so as to prevent the formation of an oxide layer such as alumina ($Al_2O_3$) on the surface of the substrate, necessitating expensive, large-sized facilities such as vacuum chambers. Further, even substrates such as AlN which are relatively easily metallized by irradiation by a laser require use of a high output pulse laser (hereinafter referred to as a YAG) of a peak output of 4 kW, a pulse width of 200 ns, and a repetition of 1 kHz. In the past, since use was made of a pulse laser, it was extremely difficult to form wiring with uniform wire widths, to increase the drawing speed, etc.

Further, regarding prior art coils, for example, as shown in, for example, U.S. Pat. No. 4,903,674, there have been proposed coils etc. attached to spark plugs of internal combustion engines. These have been manufactured by the additive method or the etching method, both of which use the above-mentioned circuit forming method, i.e., the resist method, which are complicated in steps and require difficult technology for attachment of a resist on a curved surface. Therefore, as shown in Japanese Unexamined Patent Publication (Kokai) No. 63-212285 and Japanese Unexamined Patent Publication (Kokai) No. 62-218580, consideration has been given to applying electroless plating to just the laser-irradiated portions, but as mentioned above, the formation of wiring with uniform wire widths, the increase of the drawing speed, etc. end up becoming extremely difficult.

SUMMARY OF THE INVENTION

Accordingly, the objects of the present invention are to eliminate the above-mentioned disadvantages of the prior art and to provide a plating method capable of selectively imparting an electroless plating catalyst selectively to a circuit substrate etc. simply and with few steps.

Another object of the present invention is to provide a cylindrical coil obtained by selective formation of a coil wiring pattern by plating, without the use of the resist method accompanying with its complicated steps.

In accordance with the present invention, there is provided a plating method comprising:

(1) imparting an electroless plating reaction catalyst to a surface of a substrate;

(2) deactivating or removing the electroless plating reaction catalyst imparted to the substrate surface by a reaction-catalyst selective-imparting means at only desired locations of the electroless plating reaction catalyst; and (3) applying electroless plating to the locations of the substrate having the electroless plating reaction catalyst.

In accordance with the present invention, there is also provided a cylindrical coil having a cylindrical substrate and a spiral-shaped conductor formed on at least one side surface of the substrate, obtained by imparting an electroless plating reaction catalyst on the side surface of the cylindrical substrate, then deactivating or removing the electroless plating reaction catalyst in the form of a continuous winding at the side surface of the cylindrical substrate, then causing a reaction between said electroless plating reaction catalyst and an electroless plating solution.

BRIEF DESCRIPTION OF THE DRAWINGS

The present invention will be better understood from the description set forth below with reference to the accompanying drawings, wherein.

DESCRIPTION OF THE PREFERRED EMBODIMENTS

Figure 1:
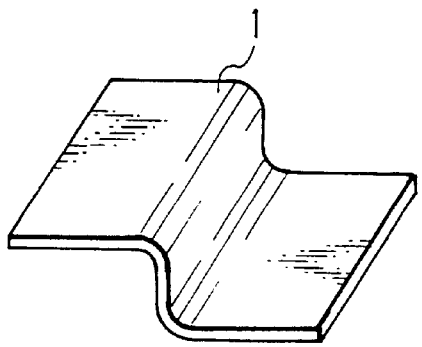
FIG. 1 is an explanatory view showing the plating method of the present invention.

In the first aspect of the present invention, the method is employed of imparting to a surface of a substrate an electroless plating reaction catalyst, deactivating or removing the electroless plating reaction catalyst imparted to the substrate surface by a reaction-catalyst selective-imparting means at only desired locations of the electroless plating reaction catalyst, and applying electroless plating to the locations to which the electroless plating reaction catalyst has been selectively applied, so use is made of the means of deactivating or removing the catalyst and therefore treatment in the atmosphere becomes possible. Further, it is sufficient merely to deactivate or remove the electroless plating reaction catalyst, so electroless plating can be applied at a low energy to predetermined portions and thus formation of wiring with uniform wiring width, an increase of the drawing speed, and the like become possible.

Further, in the second aspect of the invention, it is possible to form electroless plating enabling formation of wiring with uniform wire widths, increased drawing speeds, etc. even using a cylindrical insulating material as a substrate and with a curved side surface, so it becomes possible to obtain a winding-less cylindrical coil and it becomes possible to cut a large number of parts, lighten the weight, and reduce the size compared with conventional winding type coils.

According to the present invention, it is sufficient to deactivate or remove the electroless plating reaction catalyst, so it is possible to place the substrate in the atmosphere, so not only is it possible to reduce the cost of the facilities, but also the degree of freedom of selectively imparting the catalyst to the substrate becomes greater and easy application even to a three-dimensional circuit becomes possible. Further, the deactivation or removal of the electroless plating reaction catalyst does not require causing a reduction reaction of the substrate itself as in the past, so there is no need to use a high output pulse laser, it is possible to perform the operation with a much lower energy compared with the past, and further the speed of movement can be made faster, so miniaturization of the wiring can be realized.

Embodiments

FIGS. 1 to 6 show the plating method of the present invention.

Figure 2:
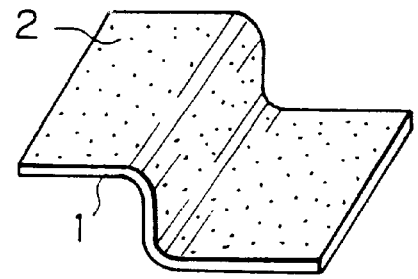
FIG. 2 is an explanatory view showing the plating method of the present invention.

Reference number 1 is the substrate used in the first embodiment. It is a flat substrate comprised of 60% alumina and the balance of silica, magnesia, kaolin, etc. The substrate 1 was degreased, then immersed for 10 minutes in a 33% by weight NaOH solution of a bath temperature of 80° C. so as to improve the adhesive power of the plating. Next, to impart the catalyst, i.e., perform the first step, the degreased substrate 1 was immersed for about 10 minutes in Activator Neogant 834 (catalyst Pd ion imparting agent made by Nihon Schering K.K.) of 40° C. so as to make bivalent Pd ions deposit on the substrate, then it was immersed for about 5 minutes in Reducer Neogant WA (catalyst Pd imparting agent made by Nihon Schering K.K.) of 40° C. to reduce the bivalent Pd to a metal and form a metal palladium layer (hereinafter referred to as metal Pd) on the surface of the substrate 1 as a whole, as shown in FIG. 2.

Figure 3:
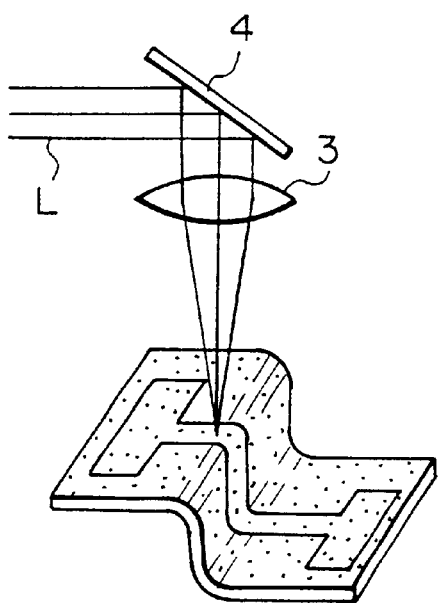
FIG. 3 is an explanatory view showing the plating method of the present invention.

Next, as a second step, as shown in FIG. 3, an argon laser beam L was irradiated in the atmosphere on the substrate 1 covered on its surface with metal Pd 2 from a not shown argon laser apparatus (Model 2020 made by Spectra Physics Co.) via condensing lenses 3 and 4 etc. condensed to a diameter of about 10 $\mu$m. At the same time, the substrate 1 was made to move at a constant speed by a not shown XY-stage carrying the substrate so as to deactivate or remove the catalyst at the portions where electroless plating was not to be applied. Next, the substrate 1 was immersed in an electroless copper plating bath (OPC Copper T made by Okano Seiyaku Kogyo), whereupon, as shown in FIG. 4, nonplated portions 6 were formed at just the locations corresponding to the laser-irradiated portions and whereupon the wiring portions 8a and the outer circumference portions 8b of the electroless plated portions 8 could be created to the portions not irradiated with the laser.

Figure 4:
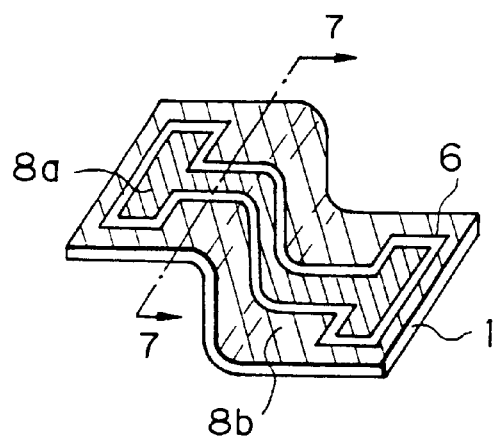
FIG. 4 is an explanatory view showing the plating method of the present invention.
Figure 7:
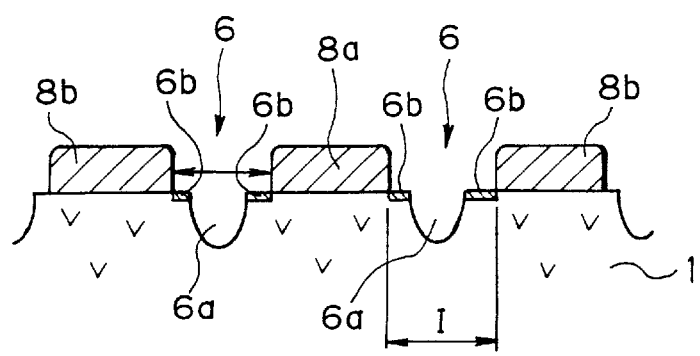
FIG. 7 is a sectional view of the plating shape obtained by the plating method of the present invention.

FIG. 7 shows the cross-section along 7—7 of FIG. 4. Between the wiring portions 8a and the outer circumference portions 8b are formed the nonplated portions 6, which nonplated portions 6 are comprised of the groove portions 6a removed by the argon laser beam L and the oxide portions 6b oxidized by the heat of the argon laser beam L. The width of the groove portions 6a is about 10 $\mu$m. The depth is 20 $\mu$m. The catalyst 2 is completely removed in the groove portions 6a, so no electroless plating film is formed at all there. The width of the oxide portions 6b is about 20 $\mu$m at both sides of the groove portions 6a. The width depends, however, on the intensity of the argon laser beam L. At this oxide portions 6b, the catalyst 2 was deactivated by the heat and no electroless plating was formed at these portions either. In other words, the catalyst could be removed and deactivated as mentioned above by irradiation by the argon laser beam L, so it was possible to eliminate the formation of the electroless plating film at just the desired portions.

Further, in the present embodiment, by causing the groove portions 6a to be formed between the wiring portions 8a and the outer circumference portions 8b, the distance between the wiring portions 8a and the outer circumference portions 8b is made greater than the mere straight line distance, whereby the distance along the surface between the wiring portions 8a is lengthened and the withstand voltage becomes greater.

Figure 5:
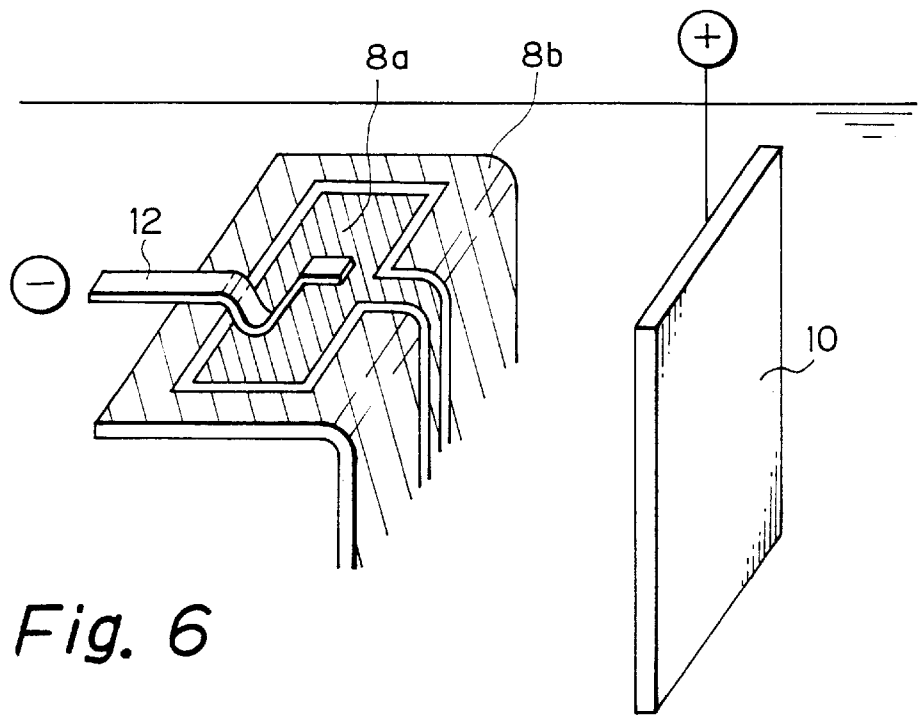
FIG. 5 is an explanatory view showing the plating method of the present invention.

When reducing the resistance of the wiring formed, one may increase the thickness by further electroless plating alone at the catalyst-imparted substrate 1 irradiated by the laser beam at the outer circumference portions of the wiring portions 8a shown in FIG. 4 or else may apply electroless plating to 2 to 3 $\mu$m as a base layer, then immerse a catalyst imparted substrate 1 having the electroless plated portions 8 and the anode electrode 10 in an electrolytic solution comprised of a copper sulfate plating bath, for example, as shown in FIG. 5, then apply the cathode to the catalyst-imparted substrate 1 by the cathode electrode 12 so as to create the desired film thickness.

Figure 6:
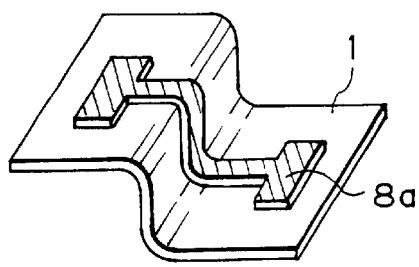
FIG. 6 is an explanatory view showing the plating method of the present invention.

When applying such electroplating, in particular when using a copper sulfate plating bath, by plating to increase the thickness of the wiring portions 8a and at the same time etching (removing) the copper of the outer circumference portions 8b other than the wiring portions 8a, it becomes possible to obtain the substrate 1 having only the wiring portions 8a as shown in FIG. 6.

Figure 8:
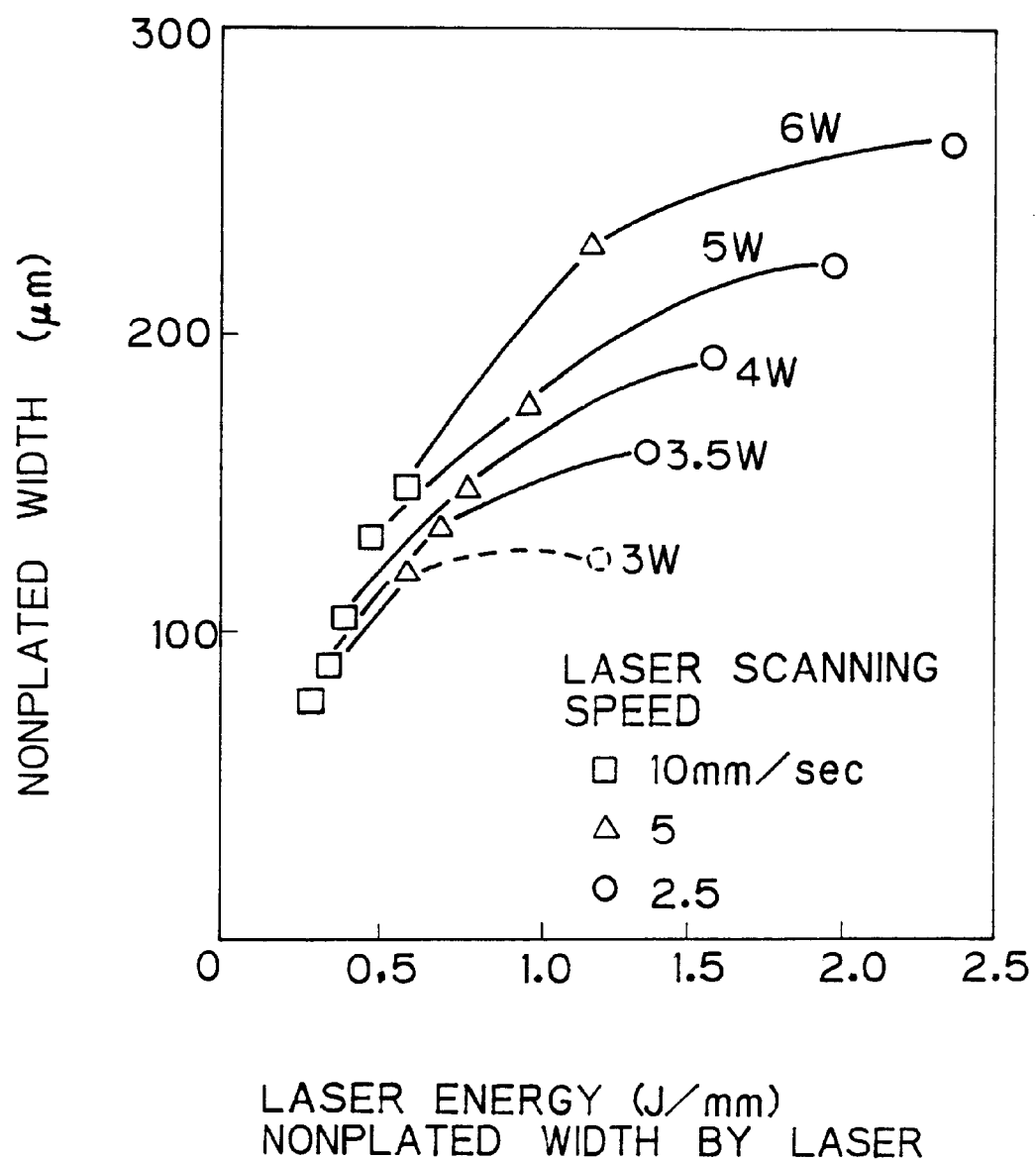
FIG. 8 is a graph of the relationship of the nonplated width to the laser energy.
Figure 9A:
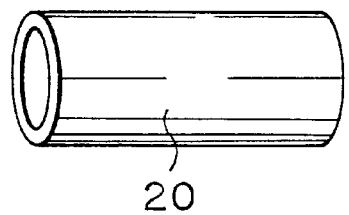
FIGS. 9(a), 9(b), 9(c) and 9(d) are explanatory views showing the plating method of a second embodiment of the present invention.
Figure 9B:
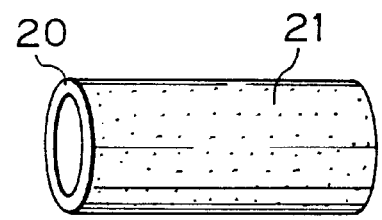
Figure 9C:
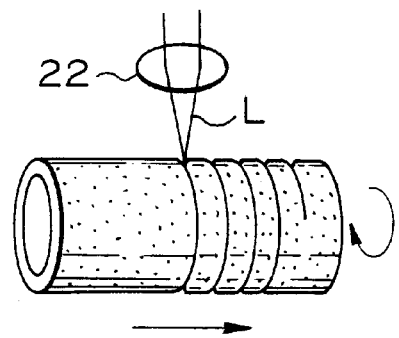
Figure 9D:
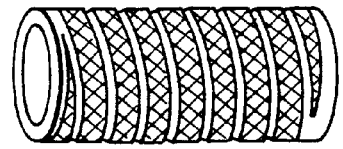

FIG. 8 shows the relationship with the nonplated width when changing the irradiated laser output and changing the speed of movement of the substrate.

Here, the "nonplated width" refers to the width of the nonplated portion 6 shown by 1 in FIG. 7.

The type of substrate and the laser used are the same as the ones used in the previous embodiment. The only difference from the previous embodiment is that the output and the speed of movement are changed.

As clear from FIG. 8, the nonplated width is determined by the laser output and the speed of the member (relative speed of beam and member) when the condensed diameter is constant. That is, the lower the laser output, the smaller the nonplated width may be made and therefore the more formation of fine wiring becomes possible. When the laser output is too low or the rotational speed (relative speed) is too fast, however, the catalytic action of the Pd is not lost, it is learned.

Further, as mentioned above, under conditions where the irradiated portion becomes nonplated, processing grooves are formed in the substrates by the laser and the distance along the surface between the wirings becomes longer, which is advantageous in terms of the insulation between wirings.

In the above embodiment, after careful study, it was found that a substrate having a pattern with a wiring width/wiring space of 50/50 $\mu$m (copper plated layer of 10 $\mu$m) can be obtained under conditions of a laser output of 5W and a speed of movement of 50 mm/sec.

Further, to obtain the desired wiring width in substrates of various materials, it is sufficient to experiment in the same way as with FIG. 8 in advance for each substrate and obtain a grasp of the nonplated width.

Next, a detailed explanation will be given, as a second embodiment, of a process of production of a cylindrical coil of the second aspect of the invention using the above plating method.

FIG. 9(*a*) shows a cylindrical member 20 comprised of 60% alumina ceramic formed to an outer diameter of 13 mm, an inner diameter of 9 mm, and a length of 70 mm.

This cylindrical member 20 was degreased, then etched by immersion in 33% NaOH, then the electroless plating reaction catalyst, metal Pd, was imparted to the cylindrical member 20 as a whole by Activator Neogant 834 and Reducer Neogant WA made by Nihon Schering K.K. FIG. 9(*b*) shows the cylindrical member 20 on whose outer surface the metal Pd layer 21 was formed.

Next, as shown in FIG. 9(*c*), an argon laser beam L of an output of 6W was condensed to a diameter of about 10 $\mu$m by a lens 22 and irradiated in a spiral-manner. The rotational speed of the cylindrical member 20 was made 1.0 sec/rev and the speed of movement was made 100 $\mu$m/sec. By the irradiation of the argon laser beam, it was possible to remove or deactivate the metal Pd layer at the irradiated portions.

After the irradiation of the laser beam, the cylindrical member 20 was immersed for 30 seconds in an electroless copper plating bath (OPC Copper T made by Okano Seiyaku Kogyo), whereupon it was possible to obtain a winding-free fine cylindrical coil with a wiring width/wiring space of 40/60 $\mu$m (plating thickness of 2 $\mu$m) as shown in FIG. 9(*d*).

Here, the pitch of the coil wiring may be adjusted as desired by the rotational speed of the cylindrical member and the speed of equilibrium movement.

Further, the wiring width is determined by the set wiring pitch and the nonplated width of the Pd catalyst caused by the laser beam.

Next, a detailed explanation will be made of a cylindrical coil with a coil formed not only at the outer surface of the cylindrical member, but also at the inner surface, which had been impossible in prior art windings, as a third embodiment, and to a process for production of the same.

Figure 10:
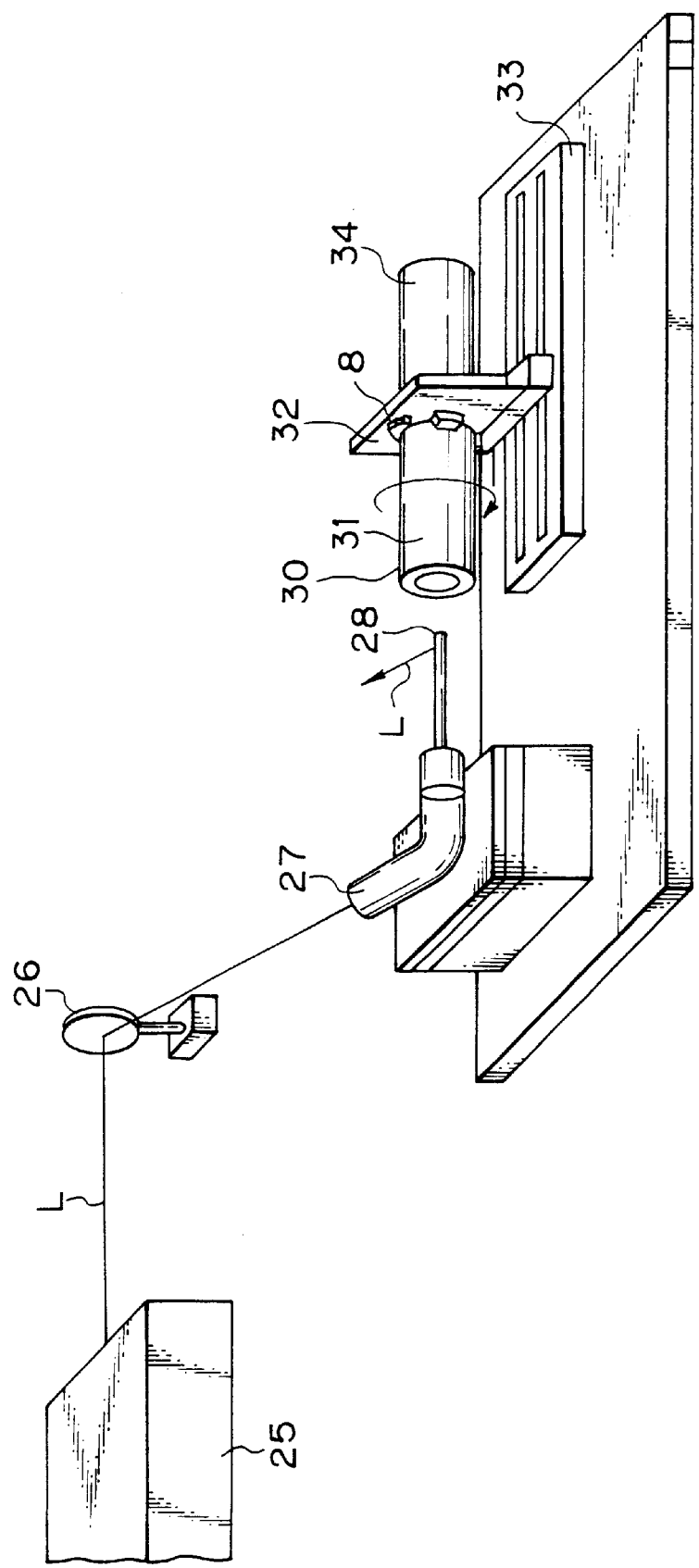
FIG. 10 is a perspective view of an apparatus used in a third embodiment of the present invention.

FIG. 10 is view of the apparatus used for the third embodiment.

In FIG. 10, 25 is an argon gas laser generator—a Model 12020 argon gas laser unit made by Spectra Physics Co. The argon laser beam L issued from this laser generator 25 passes via the reflecting lens 26 and the condensing unit 27 so that the laser beam is irradiated only in a predetermined direction from the laser irradiation portion 28 provided at the tip of the condensing unit 27.

The cylindrical member 30 is comprised of 60% alumina and is 100 mm in length, 16 mm in outer diameter, and 13 mm in inner diameter (thickness of 1.5 mm). The cylindrical member 30 was degreased, then etched by immersion in 33% NaOH, then a metal Pd layer 31 was imparted to the inner surface 30a of cylindrical member 30 and outer surface 30b of the cylindrical member 30 as a whole by Activator Neogant 834 and Reducer Neogant WA made by Nihon Schering K.K.

The cylindrical member 30 with the metal Pd layer 31 is fixed in place by a work clamp 32. The work clamp 32 is arranged on an X-stage 33 which can be moved in the left and right directions. It is rotatable along with the cylindrical member 30 by a motor 34. The numeral 8 shows the electroless plated portions.

The apparatus shown in FIG. 10 is employed to fabricate a primary coil (low voltage side) at the outer surface 30a of the cylindrical member 30 and a secondary coil (high voltage side) at the inner surface 30b.

The method of irradiation of the laser beam on the inner surface 30a and the outer surface 30b of the cylindrical member 30 using the apparatus of FIG. 10 will be explained below using FIG. 11 and FIG. 12.

Figure 11:
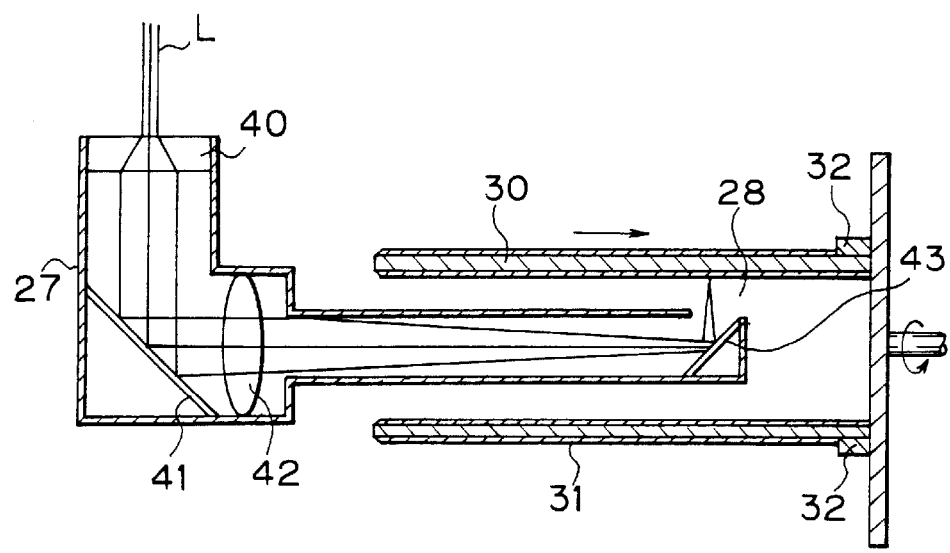
FIG. 11 is an explanatory view showing the second step of the plating method of the third embodiment of the present invention.
Figure 12:
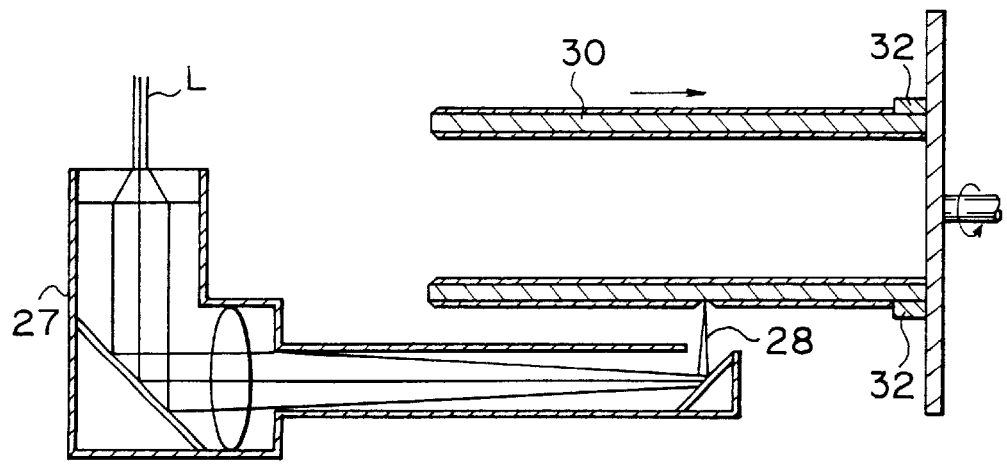
FIG. 12 is an explanatory view showing the second step of the plating method of the third embodiment of the present invention.

FIG. 11 and FIG. 12 are sectional views of the above-mentioned condensing unit 27 and schematic views showing the method of irradiation of an argon laser beam L to the inner circumferential surface 30a and the outer circumferential surface 30b of the cylindrical member 30. When irradiating an argon laser beam L to the inner surface 30a of the cylindrical member 30, as shown in FIG. 11, first the laser irradiation portion 28 of the condensing unit 27 is disposed at the inner surface 30a of the cylindrical member 30. Next, the argon laser beam L is issued from the laser generator 25 (see FIG. 10), whereupon the argon laser beam L passes via the reflecting plate 26 (see FIG. 10) to the condensing unit 27. The argon laser L incident here travels in the condensing unit 27 via a beam expander 40, reflecting mirror 41, condensing lens 42, and reflecting mirror 43 and is irradiated from the laser irradiation portion 28 to the inner surface 30a of the cylindrical member 30. While the argon laser beam L is being irradiated from the irradiation portion 28, the cylindrical member 30 is being rotated by the motor 34 (see FIG. 10) and the cylindrical member 30 is being moved by the X-stage 33. Due to the rotation and movement of the cylindrical member 30, the argon laser beam L is irradiated in a spiral fashion on the inner surface 30a. After the argon laser L is irradiated enough for a predetermined number of turns, the X-stage 33 is moved so as to take the laser irradiation portion 28 out from the inside of the cylindrical member 30.

Next, the outer surface 30b of the cylindrical member 30 is irradiated by the argon laser beam L. The irradiation of the outer surface 30b is performed, as shown in FIG. 12, by arranging the laser irradiation portion 28 of the condensing unit 27 at a predetermined location of the cylindrical member 30 by moving the X-stage 33 and the condensing unit 27. After this, in the same way as with the case of irradiating a laser beam on the inner surface 30a, a laser beam is irradiated from the laser irradiation portion 28. By rotating and moving the cylindrical member 30, the laser beam is made to irradiate in a spiral fashion on the outer surface 30b of the cylindrical member 30.

Table 1 shows the conditions, such as the rotational speed of the cylindrical member 30, at the time of laser irradiation.

TABLE 1

|  | Outer surface side | Inner surface side |
| --- | --- | --- |
| Rotational speed of member | 10 sec/rev | 1 sec/rev |
| Speed of movement in lateral direction | 1000 µm/sec | 100 µm/sec |
| Wiring space | 10,000 µm | 100 µm |
| Laser output | 5W | 5W |

By doing the above, it is possible to irradiate a laser beam in a spiral fashion at both the inner surface 30a and the outer surface 30b of the cylindrical member 30.

The cylindrical member 30 irradiated with the laser beam in a spiral manner was immersed in a not shown OPC Copper T electroless copper plating bath made by Okano Seiyaku Kogyo and plated to a thickness of 25 µm, thereby obtaining a cylindrical member 30 with conductive electroless plating formed in a spiral fashion on the inner and outer surfaces.

The structure of this cylindrical member 30 is shown in Table 2.

TABLE 2

|  | Outer surface side | Inner surface side |
| --- | --- | --- |
| No. of turns | 10 | 1000 |
| Wiring width/Wiring space | 9800 µm/200 µm | 50 µm/50 µm |
| Wiring sectional area | 0.245 mm² | 0.00125 mm² |

Figure 13:
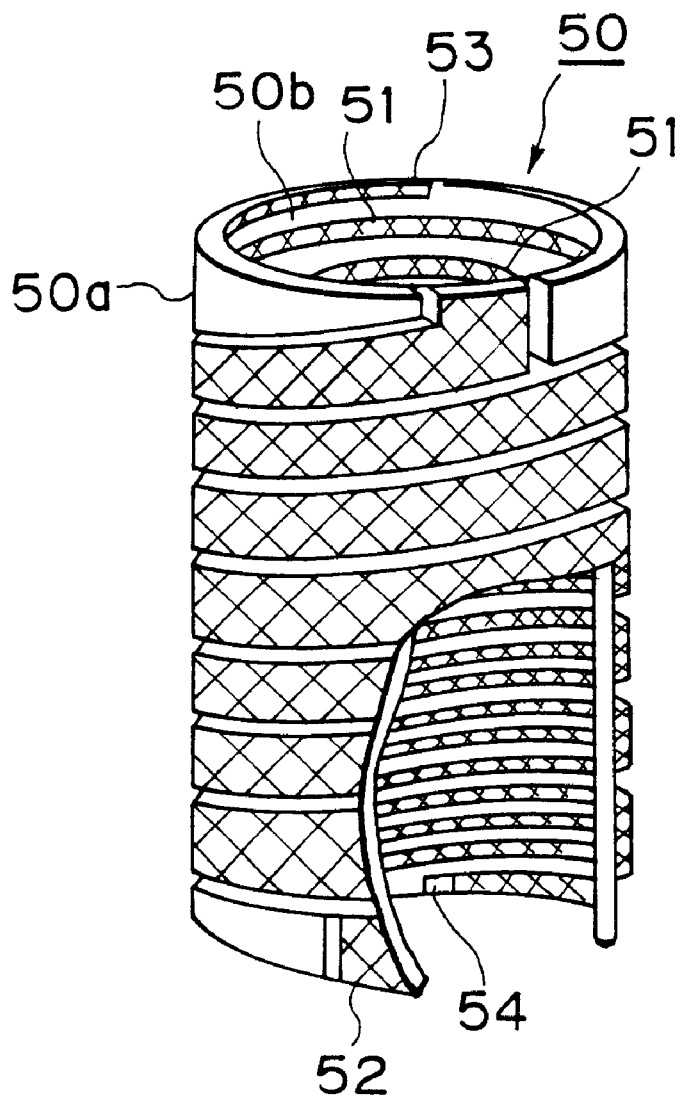
FIG. 13 is a schematic view showing the cylindrical coil obtained by the third embodiment of the present invention.

FIG. 13 shows the outer appearance of the cylindrical member after coil formation.

The sectional areas of the wirings of the outer surface side 50a and the inner surface side 50b of the winding-less cylindrical coil 50 obtained by the third embodiment shown in FIG. 13 are, as shown in Table 2, 0.245 mm² and 0.00125 mm², respectively, which corresponds to a diameter of a winding in a conventional winding coil of 560 µmϕ in the case of the outer surface side 50a and 40 µmϕ in the case of the inner surface side 50b.

If a not shown magnetic core is inserted into the magnetic hole 51 of the cylindrical coil 50 and a primary voltage is applied to the two ends 51 and 52 of the wiring formed on the outer surface side 50a, it is possible to generate a secondary voltage between the two ends 53 and 54 of the wiring formed at the inner surface side 50b.

In the third embodiment, the secondary voltage was made 100 times the primary voltage in design, but when a greater secondary voltage is required, use may be made of a longer cylindrical member or use may be made of cylindrical members with different diameters places one inside the other to make multiple layers.

Finally, we considered that there might be substrate conditions excellent for the plating method of the present invention and therefore engaged in careful studies on the selection of the substrate.

That is, the present invention is characterized in that the second step of selectively removing or deactivating the electroless plating reaction catalyst is applied to the substrate to which the first step of imparting an electroless plating reaction catalyst was applied and in that the substrate to which the second step was applied is immersed in an electroless plating bath so as to selectively apply the electroless plating to the substrate. In our further studies, however, we discovered that it is not possible to achieve the desired removal or deactivation when using a laser beam for removal or deactivation of the catalyst for some types of substrates.

Therefore, the reason for this was searched for by taking note of the characteristics of the substrate, whereupon it was discovered for the first time that in the case of an alumina type ceramic, there is a close relationship between the heat conductivity of the substrate and the nonplated width of the catalyst (corresponding to 6b in FIG. 7).

Figure 14:
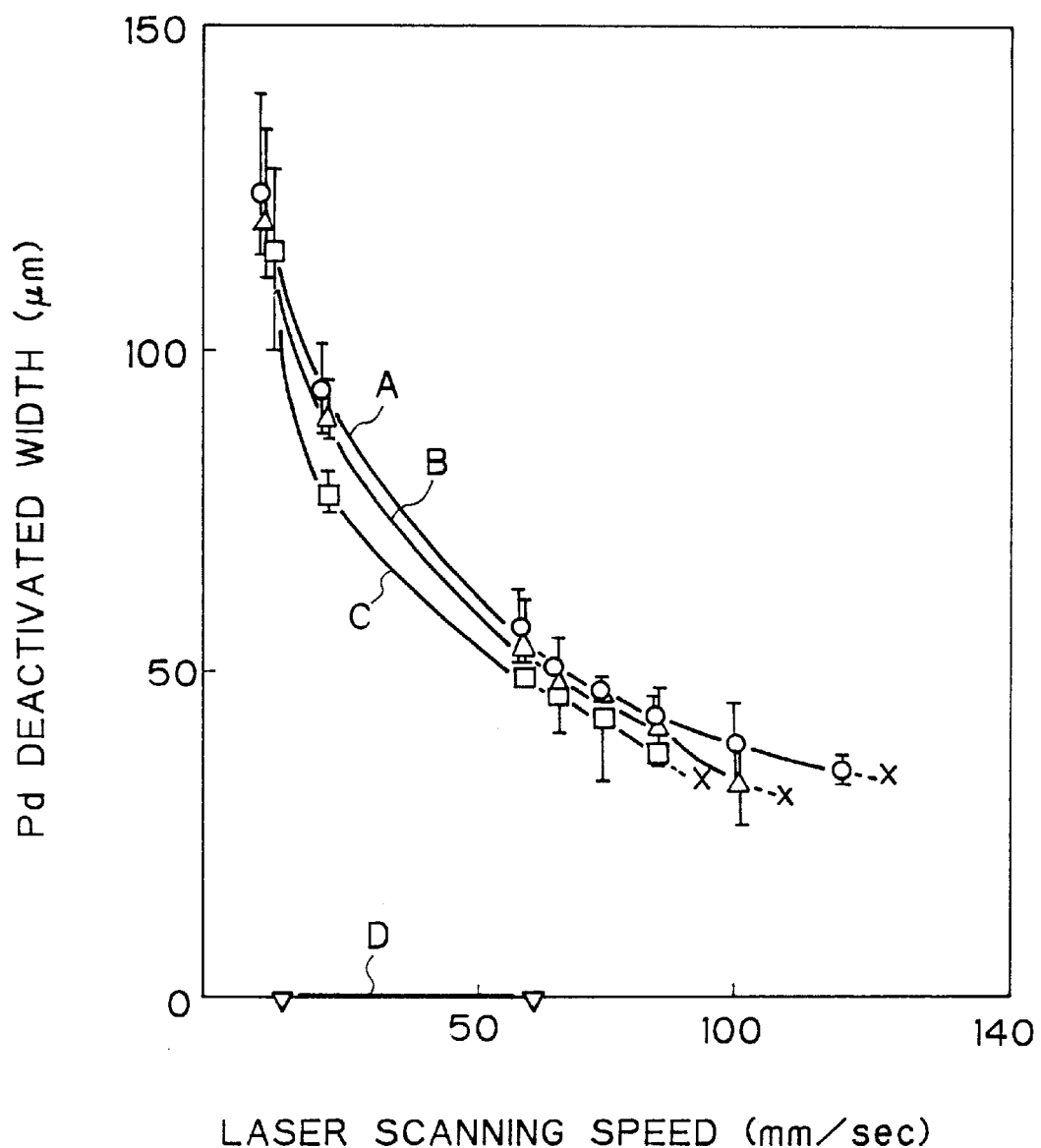
FIG. 14 is a graph showing the relationship of the nonplated width of the metal Pd catalyst with the laser scanning speed.

FIG. 14 is a graph showing the relationship between the laser scanning speed and the nonplated width of the metal Pd catalyst when changing the material of the cylindrical member 20 used in the second embodiment. Here, the laser scanning speed is changed by changing the rotational speed of the cylindrical member 20. Further, the laser output was made 5W.

Here, as the material of the cylindrical member, use was made of 60% alumina (corresponding to heat conductivity of about 4.6 W/m° C.) as A, 70% alumina (corresponding to heat conductivity of about 6.3 W/m° C.) as B, 80% alumina (corresponding to heat conductivity of about 8.4 W/m° C.) as C, and 95% alumina (corresponding to heat conductivity of about 14.6 to 31.0 W/m° C.) as D. The results are shown in FIG. 14.

As a result, if a good value of the heat conductivity of the cylindrical member is 4.5 to 8.4 W/mK, it is learned that it is possible to obtain the desired extent of catalyst deactivation by adjusting the laser scanning speed. That is, when the heat conductivity of the substrate is smaller than 4.5 W/mK, in the case of an alumina type ceramic, the substrate itself becomes extremely brittle and ends up no longer suitable for practical use. Further, when larger than 14.5 W/mK, as shown in FIG. 14, a sufficient nonplated width ends up not being able to be formed and, therefore, the desired nonplated width ends up no longer able to be formed.

Further, in the above embodiments, use was made of an argon laser beam as the reaction-catalyst selective-imparting means, but the present invention is not limited to an argon laser beam. Any means may be used if it causes deactivation of the catalyst applied to the substrate, for example, a YAG laser, carbon dioxide gas laser, excimer laser, electron beam, without regarding to continuous emission or pulsed emission.

Further, in the embodiments, as the substrate, use was made of a substrate comprised of a ceramic, but the substrate is not limited to a ceramic. It may also be, for example, a resin the substrate made of, for example, ABS, polypropylene, polycarbonate, epoxy.

Further, in the above embodiments, grooves were formed in the substrate by a laser, but it is possible not to form these grooves, but merely to cause only deactivation of the catalyst by the heat of a laser etc.

Still further, in the above embodiments, the wiring circuit was formed by applying an electroless copper plating film, but the invention may also be applied to any other kind of electroless plating aside from electroless copper plating. For example, it is possible to cause the formation of a resistor by forming an electroless plating film with a large film resistance such as electroless nickel-phosphorus, nickel-tungsten-phosphorus, etc.

Also, in the above embodiments, use was made of Pd as the electroless plating reaction catalyst, but Ag, Pt, or anything else serving as an electroless plating reaction catalyst may be also used.

What is claimed is:

1. A method for producing a cylindrical coil comprising the steps of:
   (i) imparting an electroless plating reaction catalyst to at least an outside surface of an insulation cylindrical substrate having a heat conductivity of 4.5 to 8.4 W/m° C.;
   (ii) deactivating the electroless plating reaction catalyst in the form of a continuous winding on a side surface of the insulation cylindrical substrate by irradiating a predetermined portion of the electroless plating reaction catalyst by a laser beam, whereby groove portions are formed by removing a part of the substrate corresponding to the groove portions, from which the electroless plating reaction catalyst is removed, and the electroless plating reaction catalyst of sides of the groove portions are deactivated;
   (iii) applying an electroless plating solution to the insulation cylindrical substrate; and
   (iv) allowing the electroless plating reaction catalyst to react with an electroless plating solution.

2. A method for producing a cylindrical coil as claimed in claim 1 wherein the groove portions have a width of 10 $\mu$m or more and a depth of 20 $\mu$m or more.

3. A method for producing a cylindrical coil as claimed in claim 1, wherein the electroless plating reaction catalyst is imparted to an inside surface of the insulation cylindrical substrate, in addition to the outside surface of the insulation cylindrical substrate.

4. A method for producing a cylindrical coil as claimed in claim 1, wherein the electroless plating reaction catalyst is deactivated and removed by the laser beam.

* * * * *